United States Patent
Rieken

[11] Patent Number: 5,875,091
[45] Date of Patent: Feb. 23, 1999

[54] BUSBARS WITH FILTER CAPACITORS

[75] Inventor: Ralf Rieken, Horn-Bad Meinberg, Germany

[73] Assignee: Siemens Nixdorf Informationssysteme Aktiengesellschaft, Germany

[21] Appl. No.: 765,765

[22] Filed: Jan. 7, 1997

[51] Int. Cl.$^6$ .............................. H01G 4/38; H05K 7/02; H01R 9/00

[52] U.S. Cl. .................... 361/328; 361/775; 361/782; 361/811

[58] Field of Search ........................................ 361/763, 766, 361/775, 782, 807, 809–811, 821, 825, 328–330; 174/72 B, 71 B, 88 B, 70 B

[56] References Cited

U.S. PATENT DOCUMENTS

| | | |
|---|---|---|
| 4,401,844 | 8/1983 | Fleuret . |
| 4,697,858 | 10/1987 | Balakrishman . |
| 4,878,155 | 10/1989 | Conley . |
| 5,161,086 | 11/1992 | Howard et al. . |

FOREIGN PATENT DOCUMENTS

| | | |
|---|---|---|
| 39 25 554 A1 | 7/1991 | Germany . |
| 33 24 295 C2 | 3/1992 | Germany . |
| 2 238 431 A | 5/1991 | United Kingdom . |

*Primary Examiner*—Bot L. Ledynh
*Attorney, Agent, or Firm*—Hill & Simpson

[57] ABSTRACT

An arrangement of an isolating support board having conductive surfaces between busbars, the support board having a portion projecting beyond the busbars in the transverse direction, and filter capacitors connected to the conductive surfaces being fastened on the projecting portion.

4 Claims, 1 Drawing Sheet

BUSBARS WITH FILTER CAPACITORS

BACKGROUND OF THE INVENTION

1. Field of the Invention

The arrangement relates to the mounting of filter capacitors in power supplies using busbars.

2. Description of the Prior Art

In the case of data processing systems having a relatively high power consumption, in particular, the operating voltage is fed via busbars to a backplane. Filter capacitors are arranged on the backplane, which is designed as a printed circuit board. The filter capacitors occupy valuable space on the backplane due to their large capacitance and the large value necessitated thereby. In order to avoid this, filter capacitors have previously been screwed to the chassis and connected to the backplane by short additional connecting lines.

SUMMARY OF THE INVENTION

An object of the invention is to arrange filter capacitors with a low mounting expense and space requirement.

The invention contains the insight that when supplying the backplane using busbars, the insulating layer between the busbars can be replaced by a printed circuit board whose surfaces make good contact with the busbars due to the mechanical interconnection of the busbars which exists in any case. The printed circuit board projects laterally beyond the busbars, that is to say in the transverse direction with respect to the running direction of the busbars. Capacitors which are connected to the surfaces are arranged on the projecting part. These printed circuit boards with the filter capacitors are easy to produce and can be mounted virtually with no additional expense since they are mounted instead of the insulating layer used to date. In this way, the filter capacitors neither occupy space on the backplane nor do they have to be mounted and connected in a separate work operation. The arrangement along the busbars additionally enables a large number of relatively small filter capacitors to be used, which leads to a small series resistance and thus to an excellent filter effect. As a result of the distribution of the filter capacitance over a considerable part of the busbar, the inductance of the latter also becomes less effective, with the result that the power supply unit becomes simpler and more stable during operation.

A busbar assembly designed in this way can also be used on the backplane for distributing the supply voltages, since connection lugs are integrally formed on the busbars, on the side facing away from the capacitors, which lugs are then each connected to feeding points on the backplane. This connection can be effected by short cables, a plug connection or a soldered joint.

If the intention is to supply two voltages at the same ground potential, then three busbars are used in a preferred development, the middle busbar carrying ground potential and a support board with filter capacitors are arranged in each case between the middle busbar and an edge busbar.

DESCRIPTION OF THE PREFERRED EMBODIMENTS

Figure 1:
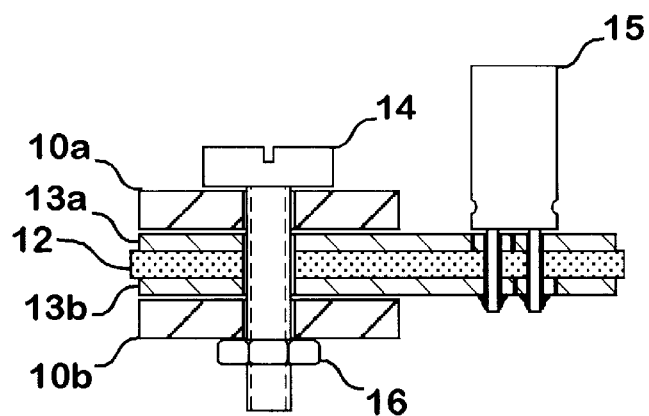
FIG. 1 shows a busbar assembly as a section in the running direction of the busbars.
Figure 2:
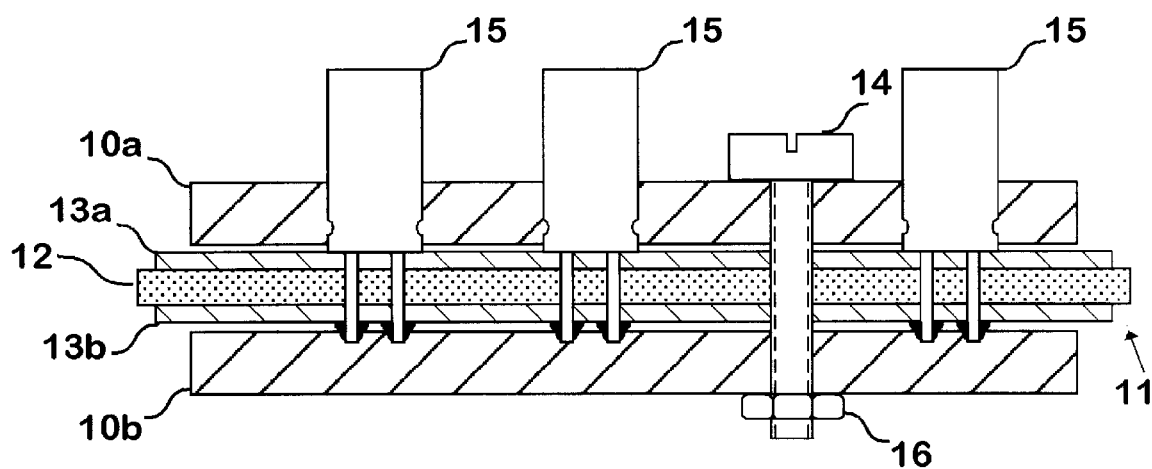
FIG. 2 shows the arrangement according to FIG. 1 in a side view.

FIG. 1 illustrates two busbars 10a, 10b, which carry a different potential. The busbars are connected to one another by a fastening, which is symbolically illustrated in the drawing by a screw 14 and nut 16. This fastening must, of course, be embodied in an insulated manner.

The busbars are electrically isolated by a printed circuit board 11, which is embodied, in a known two-sided design, by an insulating support layer 12 and two conductive layers 13, 13b which are applied to the surfaces and are usually made of copper with a surface refinement.

The printed circuit board 11 is wider on one side than the busbars and thus extends beyond the busbars transversely with respect to the main direction of the busbars. Filter capacitors 15 are fastened in a known manner on this projecting area, which filter capacitors are illustrated here as can capacitors, one pole of which is connected to the conductive layer 13a and the other pole of which is connected to the conductive layer 13b, usually by soldering. A relatively large number of these capacitors are present along the busbar, as symbolized in FIG. 3. The number of capacitors depends on the length of the busbar and their capacitance is then the corresponding fraction of the total required capacitance.

Holes are provided in the printed circuit board 11 for the fastenings 14, 16 (not emphasized in the figures). These holes can be designed as elongated holes 17 (shown only once in FIG. 3) which extend to the edge of the printed circuit board, so that the printed circuit board together with the capacitors can be withdrawn, following the release of the connections, on the side carrying the capacitors, and be replaced by another specimen. This simplifies disassembly and permits simple repair after delivery.

Figure 3:
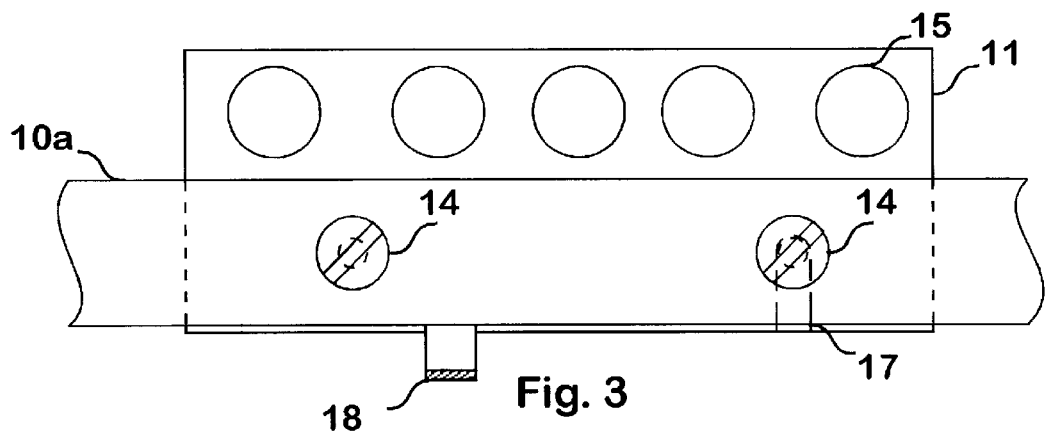
FIG. 3 shows the same arrangement in a plan view.

Connection points 18 can be integrally formed on the busbars. The connection points either make contact with direct connectors or, if provided with holes, are screwed directly to a backplane, for example. In this case, the busbar assembly can run transversely across the backplane and provide a buffered DC voltage at a plurality of points, without space for the buffer capacitors being required on the backplane. To give a better overall view, FIG. 3 shows such a connection 18 only once for the upper busbar; the same applies correspondingly to the lower busbar (not visible).

Not shown in the figures is the expansion to more than two busbars, in which case a busbar and a printed circuit board are placed alternately one on top of the other. A busbar for ground then preferably lies in the center. The lower printed circuit board is then designed to be wider, with the result that the capacitors are not hindered by the upper printed circuit board.

Although various minor changes and modifications might be proposed by those skilled in the art, it will be understood that my wish is to include within the claims of the patent warranted hereon all such changes and modifications as reasonably come within my contribution to the art.

I claim:

1. An arrangement of opposite polarity busbars with filter capacitors for a voltage passed via the busbars, comprising:

the busbars run parallel with respect to one another and are mechanically connected to one another by fastenings;

a support board which isolates the busbars and is fastened between the two busbars;

the support board being provided with an electrically conductive layer on each of two opposite surfaces;

the conductive layers being pressed against the busbars by the fastenings and electrically connected to said busbars;

filter capacitors arranged on a portion of the support board which projects beyond the busbars in transverse direction; and poles of the filter capacitors are each connected to one of the two conductive layers.

2. The arrangement according to claim 1 wherein connection elements to which loads can be connected being provided along the busbars.

3. The arrangement according to claim 1 wherein the busbars are fastened to one another by fastening elements guided through holes in the busbars and in the support board, and the holes in the support board being designed as elongated holes running to an edge of the board and are open there.

4. An arrangement of busbars for providing an operating voltage to a system, comprising:

first and second busbars running parallel with respect to one another and mechanically connected to one another;

a support board having electrically conductive respective layers on opposite surfaces, said support board being fastened between the two busbars such that the conductive layers are pressed against the respective busbars and electrically connected to the busbars;

filter capacitors arranged on a portion of the support board which projects beyond the busbars in a direction transverse to a longitudinal extent of the busbars; and poles of the filter capacitors being connected via the conductive layers to the respective busbars.

\* \* \* \* \*